United States Patent [19]
De Becker et al.

[11] Patent Number: 5,773,975
[45] Date of Patent: Jun. 30, 1998

[54] METHOD OF AND DEVICE FOR MEASURING THE VELOCITY OF MOVING MATTER BY MEANS OF MAGNETIC RESONANCE

[75] Inventors: Jan F. L. De Becker; Thomas L. M. Hoogenboom; Miha Fuderer, all of Eindhoven, Netherlands

[73] Assignee: U.S. Philips Corporation, New York, N.Y.

[21] Appl. No.: 718,807

[22] Filed: Sep. 24, 1996

[30] Foreign Application Priority Data

Sep. 25, 1995 [EP] European Pat. Off. ............. 95202580

[51] Int. Cl.⁶ .................................................. G01V 3/00
[52] U.S. Cl. .......................................... 324/306; 324/307
[58] Field of Search .................................. 324/306, 307, 324/309, 312, 314

[56] References Cited

U.S. PATENT DOCUMENTS

| Re. 32,701 | 6/1988 | Moran | 324/309 |
| 5,025,788 | 6/1991 | Dumoulin | 324/306 |
| 5,352,980 | 10/1994 | Machida | 324/306 |

OTHER PUBLICATIONS

"Dual Velocity Sensitive Tetrahedral Flor Encoding MR Angiography", by Y. Machida, et al, Proceedings of the SMRM 1992, 2810.

Primary Examiner—Louis M. Arana
Attorney, Agent, or Firm—Jack D. Slobod

[57] ABSTRACT

A method of determining a velocity of moving matter by magnetic resonance, includes a application of a phase contrast method in at least one measuring direction so as to determine a velocity. Upon determination of the velocity by means of phase contrast MRA, the cyclic nature of the phase introduces an ambiguity in the velocity determination. This ambiguity is removed by performing an additional measurement in an additional direction and by combining the velocity measured in the additional direction with the previously determined velocity. It has also been found that there is an optimum direction for this additional measurement. The advantage of the method of the invention is that the velocities can be determined and corrected in the three basic directions. As a result, low flow velocities can be determined and corrected in the three basic directions. As a result, low flow velocities can be measured, so that slow liquid flows in small blood vessels can be made visible in an MR image.

15 Claims, 4 Drawing Sheets

METHOD OF AND DEVICE FOR MEASURING THE VELOCITY OF MOVING MATTER BY MEANS OF MAGNETIC RESONANCE

BACKGROUND OF THE INVENTION

1. Field of the Invention

The invention relates to a method of determining a velocity of moving matter by means of magnetic resonance, in which a phase contrast method is applied in at least one measuring direction so as to determine in the measuring direction a velocity component but for a multiple of twice an encoding velocity.

The invention also relates to a magnetic resonance device for carrying out such a method.

2. Description of the Related Art

A method of this kind is known from U.S. Patent U.S. Re. 32,701. The known method is used in medical diagnostics, for example for phase-contrast magnetic resonance angiography (MRA). In phase-contrast MRA the phase contrast method is applied to determine the velocity (or higher temporal derivative of position) components in three independent directions of moving matter in a number of voxels of a body, the encoding velocities of the three directions preferably being chosen so as to be equal. Subsequently, the velocity component in a direction to be selected is made visible in an image.

It is a drawback of the known method that the velocity component measured in the measuring direction can be determined only but for any applicable multiple of (i.e. modulo) twice the encoding velocity in the measuring direction. Therefore, the known method does not enable measurement of an actual velocity component having an absolute value exceeding the encoding velocity in the measuring direction. The encoding velocity, therefore, is defined as the highest actual velocity that can still be measured without such an error.

SUMMARY OF THE INVENTION

It is inter alia an object of the invention to determine the actual velocity component in the measuring direction also if the actual velocity is higher than the encoding velocity. To achieve this, the method in accordance with the invention for determining the velocity of moving matter by means of magnetic resonance is characterized in that a phase contrast method is applied in an additional direction, referred to as the dewrap direction, so as to determine a velocity component but for a multiple of twice a dewrap encoding velocity, and that an actual velocity component is determined in the measuring direction by combining the determinations of the velocity component in the measuring direction and the velocity component in the dewrap direction. The idea of the invention is based on the fact that a set of equations with a number of unknowns which is one larger than the number of equations cannot be solved and that by executing an additional measurement in the dewrap direction an additional equation can be formed with the same unknowns, said additional equation being added to the set of equations so that the set of equations can be solved.

A further advantage of the invention, when applied to, for example phase contrast MRA, consists in that determination of the actual velocity, and hence the actual velocity component in the measuring direction, enables a reduction of the encoding velocity of the measuring direction and hence enhancement of the visibility of low flow velocities in small blood vessels in magnetic resonance images.

It is to be noted that the article "Dual Velocity Sensitive Tetrahedral Flow Encoding MR Angiography", by Y. Machida et al., published in Proceedings of the SMRM 1992, 2810, also proposes a method of extending a phase contrast measurement with an additional measurement. However, in the known method the additional measurement is used to obtain two MR angiography images: a first MR-A image with a sensitivity for a low velocity and a second MR-A image with a sensitivity for a high velocity. This method does not correct velocity measurements for errors amounting to multiples of twice the encoding velocity.

Preferably, the method in accordance with the invention is also characterized in that projections of velocity components in the measuring direction or the measuring directions which amount to multiples of twice the encoding velocity do not coincide on an axis in the dewrap direction. This prevents coincidence of the results of the actual velocity on the axis in the dewrap direction.

A further method in accordance with the invention is characterized in that a first velocity component is determined in a first direction with a first encoding velocity $V^1_{enc}$ and a second velocity component is determined in a second direction with a second encoding velocity $V^2_{enc}$, the second direction extending substantially perpendicularly to the first direction, a direction coefficient of the dewrap direction being determined by $$1:(2m+1)\frac{V^1_{enc}}{V^2_{enc}}$$

in which m is a positive integer. The number m is determined by the number of phase wraps to be dewrapped, i.e. for which it holds that (2m+1) times the encoding velocity is greater than the maximum actual velocity component to be measured in the measuring direction. Furthermore, the dewrap direction is situated in a plane defined by the measuring directions. If the direction coefficient of the dewrap direction is chosen in conformity with the ratio $$1:(2m+1)\frac{V^1_{enc}}{V^2_{enc}}$$

it is ensured that the possible results for the velocity components have a different projection on a line through the origin of a coordinate system in the dewrap direction. Moreover, the projections of multiples of the encoding velocities are then equidistantly situated on the line in the dewrap direction.

Another version of the method in accordance with the invention is characterized in that phase contrast measurements are applied to determine a first velocity component in a first direction with a first encoding velocity $V^1_{enc}$, a second velocity component in a second direction with a second encoding velocity $V^2_{enc}$, and a third velocity component in a third direction with a third encoding velocity $V^3_{enc}$, the three directions extending substantially perpendicularly to one another, and that the direction coefficients of the dewrap direction are determined by $$1:(2m+1)\frac{V^1_{enc}}{V^2_{enc}}:(2m+1)^2\frac{V^1_{enc}}{V^3_{enc}}$$

in which m is a positive integer. The number m is determined by the number of phase wraps to be dewrapped, i.e. for which (2m+1) times the encoding velocity is greater than the actual velocity component to be measured in a measuring direction. This step constitutes an extension of the measurement for determining the actual velocity by measurement of two velocity components in two substantially perpendicular directions. This step ensures that the projections of the possible results of the velocity components on a line through the origin differ in the dewrap direction. Moreover, the projections of multiples of the encoding velocities in the measuring directions are equidistantly situated on the line in the dewrap direction.

The invention also relates to a method of determining a derivative of a velocity by means of magnetic resonance, in which a phase contrast method is applied in at least one measuring direction so as to determine in the measuring direction a measured component of the derivative of the velocity but for a multiple of twice an encoding value, characterized in that a phase contrast method is applied in an additional direction, being the dewrap direction, so as to determine a component of a derivative of the velocity but for a multiple of twice a dewrap encoding value, and that an actual value of the derivative is determined by combining the determinations of the components of the derivatives of the velocity and the component of the derivative in the dewrap direction. Using the phase contrast measurements, first-order and higher-order derivatives of the velocity of the moving matter can also be determined, for example the acceleration, the first-order derivative of the moving matter and the jerk, a second-order derivative of the velocity of the moving matter. Because the derivative of the velocity is also a vector quantity, the actual value of a first-order or higher-order derivative of the velocity can be determined in the same way as the actual velocity of the moving matter. As in the measurement of the velocity, ambiguity due to the cyclic nature of the phase is thus removed by way of an additional measurement in an additional direction. The encoding value is then the maximum actual value which can be measured without an error amounting to a multiple of twice the encoding value.

An MR device for determining a velocity of matter by means of magnetic resonance in accordance with the invention comprises a) means for sustaining the static magnetic field,
b) means for generating RF pulses,
c) means for generating temporary magnetic gradient fields,
d) a control unit for generating control signals for the means for generating the RF pulses and for the means for generating the temporary magnetic gradient fields,
e) means for receiving, demodulating and sampling the MR signals,
f) a processing unit for processing the sampled MR signals, the control unit also being arranged to apply a phase contrast method in at least one measuring direction so as to determine in the measuring direction a velocity component but for a multiple of twice an encoding velocity, characterized in that the control unit is also arranged to apply a phase contrast method in an additional direction, being the dewrap direction so as to determine a velocity component but for a multiple of twice an encoding velocity, and that an actual velocity component is determined by combining the determinations of the velocity components in the measuring directions and the dewrap direction.

These and other aspects of the invention will be apparent from and elucidated with reference to the embodiments described hereinafter.

DETAILED DESCRIPTION OF THE PREFERRED EMBODIMENTS

Figure 1:
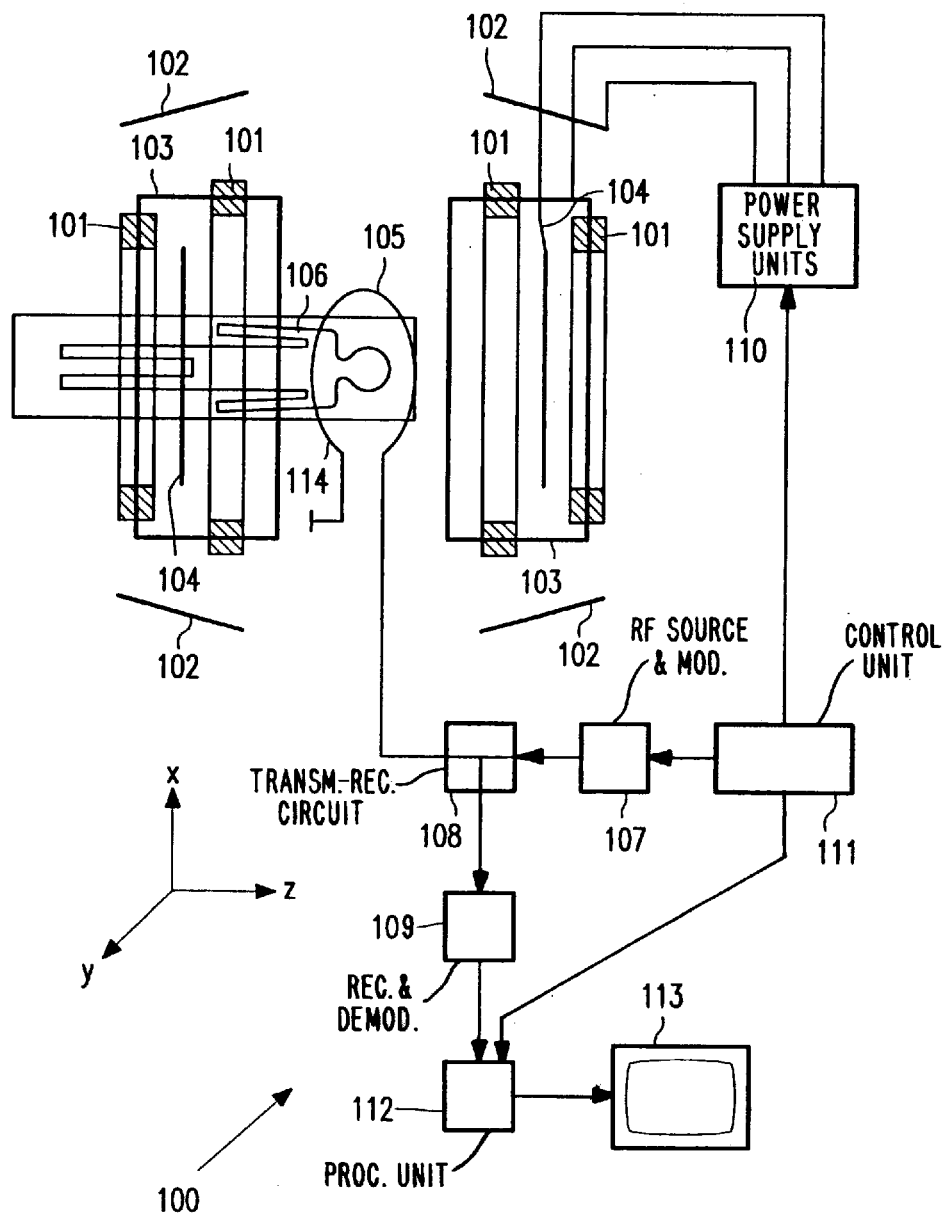
FIG. 1 shows an MR device for the imaging of objects.

FIG. 1 shows a magnetic resonance device which is known per se. The MR device 100 comprises a first magnet system 101 for generating a static magnetic field, a second magnet system 102, 103, 104 for generating temporary magnetic gradient fields in three orthogonal directions, and power supply units 110 for the second magnet system 102, 103, 104. The power supply for the first magnet system 101 is not shown. The system comprises an examination space which is large enough to receive a part of a body 106 to be examined. As is customary, in this figure and in this description the z-direction of the coordinate system shown denotes the direction of the static magnetic field. An RF transmitter coil 105 serves to generate RF fields and is connected to an RF source and modulator 107. The RF transmitter coil 105 is arranged around or against or near a part of the body in the examination space. A receiver coil 114 is used for the reception of a magnetic resonance signal. This coil may be the same coil as the RF coil 105. The RF transmitter-receiver coil 105 is connected, via a transmitter-receiver circuit 108, to a receiver and demodulation unit 109. In the signal amplifier and demodulation unit 109 a sampled phase and a sampled amplitude are derived from the MR signals received. Subsequently, the sampled phase and the sampled amplitude are applied to a processing unit 112. The processing unit 112 processes the applied phase and amplitude by way of, for example a two-dimensional Fourier transformation in order to form an image. This image is displayed by means of a monitor 113. The magnetic resonance device 100 also comprises a control unit 111. The control unit 111 generates control signals for the RF transmitter 107, the power supply units 110 and the processing unit 112.

When the magnetic resonance device is switched on while the body 106 is arranged in the magnetic field, a small majority of nuclear spins in the body is oriented in the direction of the magnetic field. In the state of equilibrium this results in a net magnetization $M_0$ of the material of the body 106, which magnetization is parallel to the direction of the magnetic field. This macroscopic magnetization $M_0$ can be modified by subjecting the body 106 to RF pulses of a frequency equal to the Larmor frequency of the nuclear spins. The nuclear spins are thus excited and the direction of the magnetization $M_0$ is changed. When the body is exposed to suitable RF pulses, the macroscopic magnetization vector is rotated, the angle of rotation being referred to as the flip angle. Introduction of changes in the magnetic field by application of temporary magnetic gradient fields locally influences the resonant frequency and the magnetization. When suitably chosen pulse sequences are used, comprising RF pulses and temporary magnetic gradient fields, MR signals are generated in the body. The MR signals provide information as regards given types of nuclei, for example hydrogen nuclei and the material containing the hydrogen nuclei. Information regarding internal structures of the body is obtained by analysis of the MR signals and the presentation thereof in the form of images. A more detailed description of the magnetic resonance imaging and magnetic resonance devices can be found in the book "Practical NMR Imaging", by M. A Foster and J. M. S. Hutchison, 1987, IRL Press.

Figure 2:
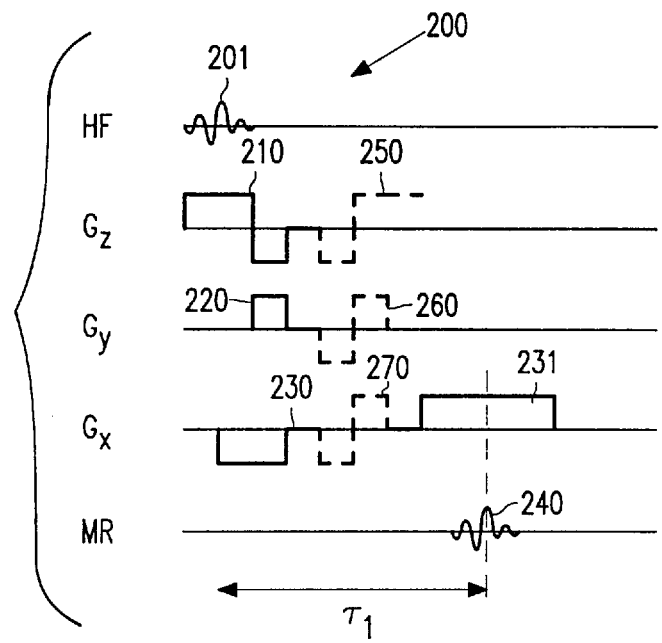
FIG. 2 shows a pulse sequence for generating a gradient echo.

FIG. 2 shows a customary RF and gradient pulse sequence for the generating of MR signals in order to form an image. The pulse sequence 200 comprises an excitation RF pulse 201 which excites the nuclear spins in a part of the body. The excitation pulse is rendered spatially selective by means of a first temporary magnetic gradient field 210 whereby a slice extending perpendicularly to the z-direction is selected. Using a second temporary magnetic gradient field 220, a phase encoding is introduced into the MR signal 240. By increasing the strength of the second temporary magnetic gradient field 220 in successive pulse sequences, for example from a minimum value to a maximum value in 256 steps, a spatial encoding can be achieved in the echo signals for the entire slice. A third temporary magnetic gradient field 230, having a gradient direction extending in the x-direction, dephases and rephases, after a period $\tau_1$, the nuclear spins so that the MR signal 240 arises. Moreover, the third temporary magnetic gradient field 230 introduces frequency encoding into the MR signal 240. The MR signal 240 received is sampled in the receiver and demodulation unit 109. In practice a value of from 64 to 512 is chosen for the number of samples. Each sample comprises a sampled phase and a sampled amplitude. Using a two-dimensional Fourier transformation, an image of, for example the density of the nuclear spins in the selected slice is derived from the sampled phases and amplitudes.

In a known phase contrast measurement, for example a phase contrast measurement as known from the cited patent specification Re. 32,701, in order to obtain a flow-sensitive phase in the MR signal 240 a motion-encoding bipolar temporary magnetic gradient field 250 is included in the pulse sequence 200 for generating the MR signal by means of the third temporary gradient field 230. The gradient direction of the first bipolar temporary magnetic gradient field is chosen to extend in a measuring direction which corresponds to the direction of a velocity component of a flow to be measured in a voxel, for example the x-direction 270, the y-direction 260 or the z-direction 250. The measured phase is subsequently dependent on the magnitude of the velocity component in the direction chosen. If the bipolar temporary magnetic gradient field contains a first-order moment $M_1$, the phase shift is given by:

$$\phi = \gamma M_1 v \quad (1)$$

in which $\phi$ is a phase shift and $\gamma$ is the gyromagnetic constant of the nuclear spins, for example the hydrogen nuclei of the moving matter. In order to prevent phase errors due to other causes, moreover, a reference measurement is carried out utilizing a second bipolar temporary magnetic gradient field whose gradient direction corresponds to the gradient direction of the first bipolar magnetic gradient field, said second bipolar temporary magnetic gradient field having a first-order moment which deviates from that of the first bipolar temporary magnetic field. Subsequently, the velocity component in the voxel is determined in the measuring direction by the complex difference of the reference measurement and the phase contrast measurement. The velocity component in the voxel in the measuring direction is then given by:

$$v = (\phi - \phi_{ref})/\gamma M_1 \quad (2)$$

It is a drawback of the known phase contrast measurement that the velocity component in the measuring direction can be determined only but for multiples of twice the encoding velocity. This encoding velocity is determined by $$V_{enc} = \frac{\pi}{\gamma M_1} \quad (3)$$

In a version of the method in accordance with the invention an additional phase contrast measurement is inserted in an additional direction, being the dewrap direction, the dewrap encoding velocity being chosen so as to be higher than the velocity component to be expected in the voxel in the dewrap direction. The measured velocity component in the dewrap direction is subsequently used to determine the actual velocity component in the measuring direction, so that the actual velocity is then known. The determination of the actual velocity from the measured velocity components in the measuring direction and the dewrap direction will be described in detail with reference to FIG. 3.

Figure 3:
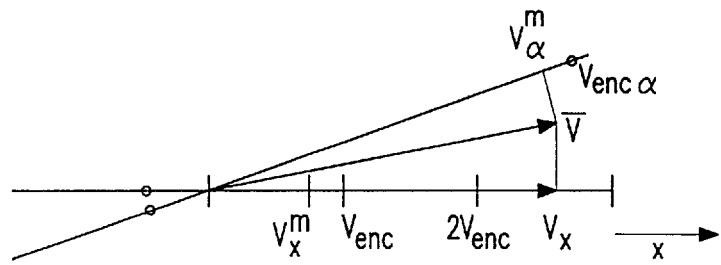
FIG. 3 shows the actual velocity and the measured velocity in a measuring direction.

FIG. 3 shows an actual velocity $\vec{v}$ associated with a voxel, a measured velocity component $v_\alpha^m$ in the dewrap direction $\alpha$, and a measured velocity component $v_x^m$ in the x-direction. An infinite set of feasible values thus exists for the actual velocity component $v_x$ to be determined in the x-direction. Thus, the following holds for the actual velocity component $v_x$:

$$v_x \in \{(v_x^m + 2l_x V_{enc})\} \quad (4)$$

in which $l_x$ represents integers and $V_{enc}$ represents the encoding velocity in the measuring direction. The projection of the actual velocity vector $\vec{v}$ on an axis in the dewrap direction $\alpha$, however, also results in $v_{60}^m$. If $v_\alpha^m$ and $v_x^m$ are known, the actual velocity vector $\vec{v}$ can be simply calculated. In FIG. 3 the actual velocity is represented by the vector $\vec{v}$ whose projection on the x-axis has the value $v_x^m + 2V_{enc}$ and whose projection on the axis in the dewrap direction is coincident with the measured $v_{60}^m$. The actual velocity in a two-dimensional example can be determined analogously. This two-dimensional example will be illustrated with reference to FIG. 4.

Figure 4:
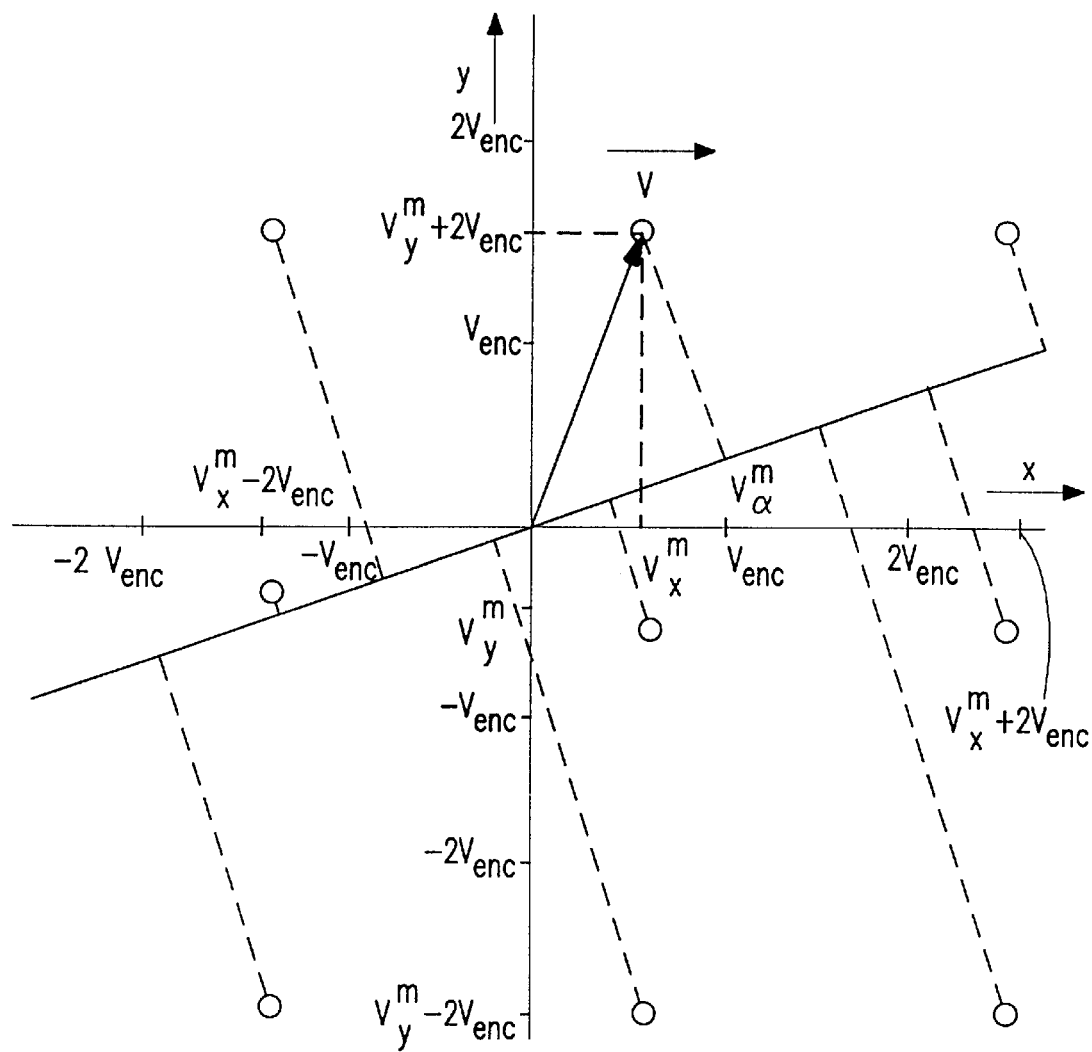
FIG. 4 shows the components of the velocity along the axes of a 2D coordinate system and the dewrap direction $\alpha$.

FIG. 4 shows a velocity $\vec{v}$ in an orthogonal system X,Y with a measured component $v_x^m$ in the x-direction, a measured component $v_y^m$ in the y-direction, and a measured component $v_{60}^m$ the dewrap direction $\alpha$. Furthermore, the encoding velocities in the x-direction and the y-direction are chosen so as to be equal; however, this is not necessarily so. Furthermore, the limits of the possible velocities $\vec{v}$, being a combination of multiples of twice the encoding velocity in the x-direction, $v_x^m + 2l_x V_{enc}$ and twice the encoding velocity in the y-direction $v_y^m + 2l_y V_{enc}$ are represented by a circle. In FIG. 4 the actual velocity is represented by the vector $\vec{v}$ whose projection on the X-axis has the value $v_x^m + 2V_{enc}$ and whose projection on the Y-axis has the value $v_y^m + 2V_{enc}$, its projection on the axis in the dewrap direction corresponding to $v_\alpha^m$.

Furthermore, another version of the method in accordance with the invention can be used to measure velocity components in three substantially perpendicular directions in a voxel of a selected slice. To this end, phase contrast measurements are carried out to determine the phases in three directions, for example the directions corresponding to the axes of an orthogonal system X,Y,Z. Furthermore, a reference phase measurement is carried out again. The velocity components along the three axes are determined by the complex difference between the reference measurement and the three respective phase contrast measurements. The velocity components in the x-direction, the y-direction and the z-direction, respectively, are then given by:

$$v_x = (\phi_x - \phi_{ref})/\gamma M_x \quad (5)$$

$$v_y = (\phi_y - \phi_{ref})/\gamma M_y \quad (6)$$

$$v_z = (\phi_z - \phi_{ref})/\gamma M_z \quad (7)$$

Using the four phase contrast measurements, the velocity components in successive measuring directions can be determined only but for multiples of twice an encoding velocity of the associated measuring direction. In the present example the encoding velocities in the three orthogonal directions are chosen to be equal. In a method in accordance with the invention an additional phase contrast measurement is carried out in an additional direction, being the dewrap direction; the dewrap encoding velocity is then higher than the velocity component to be expected in the dewrap direction. Subsequently, the velocity component measured in the dewrap direction is used to determine the actual velocity component in the x-direction, the y-direction or the z-direction, respectively. The determination of the actual velocity components is performed in the same way as the actual velocity components in the two-dimensional example. If the velocity, represented by $\vec{v} = (v_x, v_y, v_z)$ is given and if $v_x^m, v_y^m$ and $v_z^m$ represent the measured velocity components associated with a voxel in the x-direction, the y-direction and the z-direction, respectively, an infinite set of feasible values exists for the actual velocity $\vec{v} = (v_x, v_y, v_z)$. Therefore, for the actual velocity $\vec{v}$ it holds that:

$$\vec{v} \in \{(v_x^m + 2l_x V_{enc}^x, v_y^m + 2l_y V_{enc}^y, v_z^m + 2l_z V_{enc}^z)\} \quad (8)$$

in which $l_x, l_y, l_z$ are integers and $V_{enc}^x, V_{enc}^y, V_{enc}^z$ are the encoding velocity in the x-direction, the y-direction and the z-direction, respectively. The result $v_\alpha^m$ of the additional measurement in the dewrap direction a is the projection of the actual velocity vector $\vec{v}$ on an axis in the dewrap direction. If $v_x^m, v_y^m, v_z^m$ and $v_{60}^m$ are known, the actual velocity components $v_x, v_y, v_z$ can be simply determined. Assume that a phase error occurs only due to one phase cycle; $v_x$ is then situated in the interval $[-3V_{enc}^x, 3V_{enc}^x]$, $v_y$ in the interval $[-3V_{enc}^y, 3V_{enc}^y]$, $v_y$ in the interval $[-3V_{enc}^z, 3V_{enc}^z]$ and $l_x, l_y, l_z \in \{-1,0,1\}$. It is also assumed that, moreover, no phase errors occur in the measurement in the additional direction due to a velocity higher than $V_{enc}$ in the dewrap direction, so $v_{60}^m = v_{60}$.

An optimum choice of the dewrap direction α is important for the execution of the dewrap measurement. Generally speaking, the dewrap direction α is chosen so that the projections on an axis through the origin of a coordinate system in the dewrap direction a of the feasible combinations of the various encoding velocities along the axes are not coincident. The dewrap direction is also dependent on the magnitude of the actual velocity to be measured, so on the number of times that the encoding velocity is to be added to the measured velocity. One way of determining the dewrap direction will be described on the basis of a three-dimensional application. In a 3D application the dewrap direction $(\alpha_x, \alpha_y, \alpha_z)$ can be determined as follows. The measured velocity in the dewrap direction α is given by:

$$v_\alpha^m = \frac{\alpha_x v_x + \alpha_y v_y + \alpha_z v_z}{\sqrt{\alpha_x^2 + \alpha_y^2 + \alpha_z^2}} \quad (9)$$

Furthermore, the velocity measured in the dewrap direction is lower than the encoding velocity in the dewrap direction. The velocity, moreover, is determined by the velocity components $v_x^m, v_y^m$ and $v_z^m$ along the three axes X,Y,Z of the orthogonal system X,Y,Z. Subsequently, combinations of the velocity components measured along the three axes X,Y,Z are projected, with the multiples of twice the encoding velocity, on a line through the origin of the coordinate system in the dewrap direction. The projection $v_\alpha^c$ can then be written as:

$$v_\alpha^c = \frac{\alpha_x v_x^m + \alpha_y v_y^m + \alpha_z v_z^m}{\sqrt{\alpha_x^2 + \alpha_y^2 + \alpha_z^2}} \quad (10)$$

The relation between the two values for $v_\alpha$ is then given by:

$$v_\alpha^m = v_\alpha^c + 2V_{enc}^x \frac{\alpha_x l_x + \alpha_y l_y \frac{V_{enc}^y}{V_{enc}^x} + \alpha_z l_z \frac{V_{enc}^z}{V_{enc}^x}}{\sqrt{\alpha_x^2 + \alpha_y^2 + \alpha_z^2}} \quad (11)$$

This equation can be solved by determining $$\alpha_x, \alpha_y \frac{V_{enc}^y}{V_{enc}^x}, \alpha_z \frac{V_{enc}^z}{V_{enc}^x}$$

for which the sum $$\alpha_x l_x + \alpha_y l_y \frac{V_{enc}^y}{V_{enc}^x} + \alpha_z l_z \frac{V_{enc}^z}{V_{enc}^x}$$

unambiguously determines the values $l_x, l_y, l_z$. Equal values of $$\alpha_x, \alpha_y \frac{V_{enc}^y}{V_{enc}^x}, \alpha_z \frac{V_{enc}^z}{V_{enc}^x}$$

do not lead to a solution, because projections then coincide. Therefore, it is assumed that $$\alpha_x < \alpha_y \frac{V_{enc}^y}{V_{enc}^x} < \alpha_z \frac{V_{enc}^z}{V_{enc}^x} \text{ and } \alpha_x = 1$$

This can be done without loss of generality and another assumption as regards this inequality is also possible. For $l_y = l_z = 0$ the feasible values for $$\alpha_x l_x + \alpha_y l_y \frac{V_{enc}^x}{V_{enc}^y} + \alpha_z l_z \frac{V_{enc}^x}{V_{enc}^z}$$

are −1, 0, 1.

For $l_z=0$ there are the following feasible values of $$\alpha_x l_x + \alpha_y l_y \frac{V_{enc}^x}{V_{enc}^y} + \alpha_z l_z \frac{V_{enc}^x}{V_{enc}^z} \quad (12)$$

$$-\alpha_y \frac{V_{enc}^y}{V_{enc}^x} - 1, -\alpha_y \frac{V_{enc}^y}{V_{enc}^x}, -\alpha_y \frac{V_{enc}^y}{V_{enc}^x} + 1, -1, 0, 1, \alpha_y \frac{V_{enc}^y}{V_{enc}^x} - 1,$$

$$\alpha_y \frac{V_{enc}^Y}{V_{enc}^x}, \alpha_y \frac{V_{enc}^y}{V_{enc}^x} + 1$$

For suitable separation of the various projections of the velocity components $v_x^m$, $v_y^m$ en $v_z^m$, moreover, the values (12) are chosen to be equidistant and the difference between two successive values is 1, so that $$\alpha_y \frac{V_{enc}^y}{V_{enc}^x} - 1 = 2 \Rightarrow \alpha_y = 3 \frac{V_{enc}^x}{V_{enc}^y}$$

Analogously, a value is determined for $\alpha_z$. The projections are then situated at a distance from one another which is chosen to be 1; the values of the projections are then determined by the feasible values of $$l_x + 3l_y + \alpha_z \frac{V_{enc}^z}{V_{enc}^x} l_z \text{ for } l_x, l_y, l_z \quad [-1, 0, 1]$$

These values are −4−p, −3−p, −2−p, −1−p, −p, 1−p, 2−p, 3−p, 4−p, −4, −3, −2, −1, 0, 1, 2, 3, 4, −4+p, −3+p, −2+p, −1+p, p, 1+p, 2+p, 3+p, 4+p, where $$p = \alpha_z \frac{V_{enc}^z}{V_{enc}^x}.$$

From the mutually equal distance, again being 1, it then follows that 5=−4+p ⇒ p=9 and $$\alpha_z = 9 \frac{V_{enc}^x}{V_{enc}^z}.$$

For the determination of an actual velocity which is lower than three times the encoding velocity and for which, moreover, it holds that the encoding velocities in the measuring directions are equal, it suffices to carry out one additional measurement whose measuring direction is determined by $(\alpha_x, \alpha_y, \alpha_z)=(1,3,9)$ or a permutation thereof.

Generally speaking, it holds that if a velocity component $v_i$ is situated in the interval $-(2m+1)V^i_{enc}, (2m+1)V^i_{enc}$ for i=x,y of z, the ratio of $\alpha_x, \alpha_y, \alpha_z$ is determined by $$\alpha_x:\alpha_y:\alpha_z = 1:(2m+1)\frac{V_{enc}^x}{V_{enc}^y}:(2m+1)^2\frac{V_{enc}^x}{V_{enc}^z} \quad (13)$$

The derivative has been performed for a 3D measurement, but it is analogous for a 2D measurement or a 1D measurement. For a 2D measurement the direction coefficients are 1:3 and 1:5 for actual velocity components smaller than three times and five times, respectively, the encoding velocity. The preferred direction α for a 2D measurement is also shown in FIG. 5.

Figure 5:
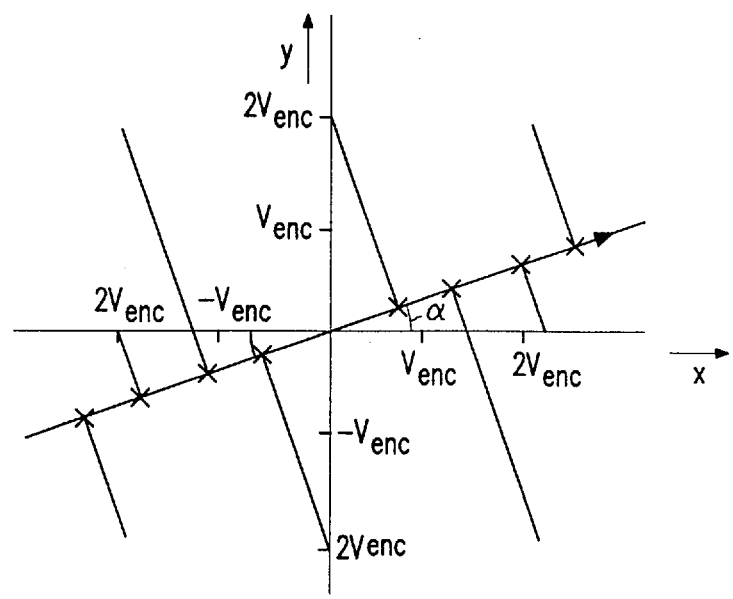
FIG. 5 shows the optimum dewrap direction in a 2D application.

FIG. 5 shows an orthogonal system X,Y with the encoding velocity $V_{enc}$ in the x-direction and the encoding velocity $V_{enc}$ in the y-direction, and with multiples thereof; because in this example the maximum actual velocity may amount to three times the encoding velocity, only the combinations of the velocity components $0+2l_x V_{enc}$, $0+2l_y V_{enc}$ for $l_x$, $l_y=-1,0,1$ are shown. Furthermore, the projections on the line in the measuring direction α are represented by means of an "x". For a 1D measurement the optimum dewrap direction is the same as the measuring direction. The advantage of a 1D measurement or a 2D measurement over a 3D measurement consists in that the requirements as regards precision can be more readily satisfied. The determination of the precision requirements imposed on the phase contrast measurement will be described with reference to FIG. 6.

Figure 6:
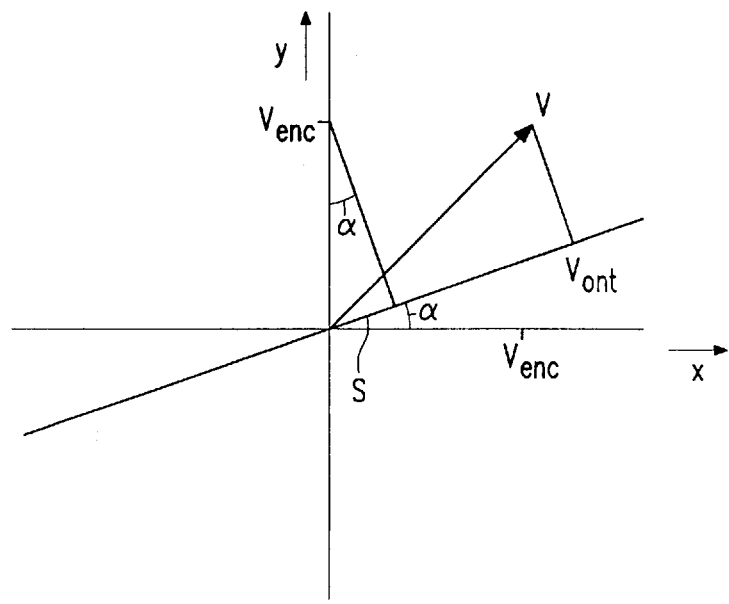
FIG. 6 illustrates the determination of the accuracy.

FIG. 6 shows an orthogonal system X,Y with the encoding velocity in the x-direction and the encoding velocity in the y-direction. The minimum encoding velocity in the dewrap direction is determined by the projection on a line in the dewrap direction of (2m+1) times encoding velocities along the axes. The actual velocity component in the x-direction, the y-direction or the z-direction is then limited by (2m+1) times the encoding velocity. In FIG. 6 the direction coefficient of the dewrap direction α is determined by tan α. The projection on the dewrap direction is determined by the vector sum of the encoding velocity in the x-direction and the encoding velocity in the y-direction and equals $\cos(45°-\alpha).\{(2m+1)\sqrt{2}V_{enc}\}$. This velocity corresponds to the minimum encoding velocity in the dewrap direction. For adequate distinction of two adjacent projections on the line in the dewrap direction, a minimum distance S is required. The distance S is given by $\sin(\alpha).V_{enc}$. The actual precision in the dewrap direction is then determined by the ratio of half the distance S to the value of the dewrap encoding velocity; this is expressed by the following formula:

$$\delta s = \frac{1}{2 \cdot (2m+1) \cdot \sqrt{2}} \frac{\sin(\alpha)}{\cos(45° - \alpha)} \quad (14)$$

For a 3D measurement with an optimum dewrap direction for which the ratio 1:3:9 holds, i.e. the maximum actual velocity components along the orthogonal axes are smaller than three times the encoding velocity, it then follows from (12) that the velocity measurement requires a precision of 1.7% of the encoding velocity in the dewrap direction. An actual velocity component to be measured, amounting to at the most five times the encoding velocity, then implies a ratio of 1:5:25 and, in conformity with (12), a measurement with 0.4% of the encoding velocity is then required. The requirements are less severe for a 2D measurement. The requirements following from (12) are then 4.2% for a measurement up to three times the encoding velocity and 1.7% for a measurement up to five times the encoding velocity. In the case of an MR device whose signal-to-noise ratio is too poor for 3D measurements, 2D measurements can be performed so as to satisfy the precision requirements. Carrying out a 1D measurement three times is also possible. A 1D measurement requires a precision of only 16.7% for a measurement up to three times the encoding velocity and of 10% for a measurement up to five times the encoding velocity.

Figure 7:
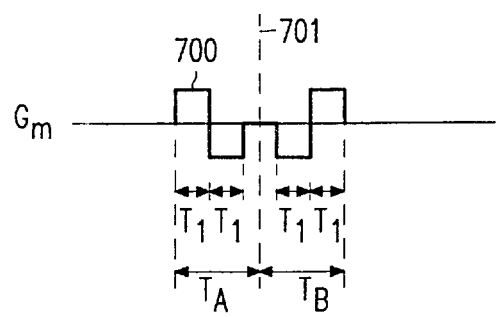
FIG. 7 shows a bipolar temporary magnetic gradient field with a second-order moment.

Furthermore, the method of the invention can also be used in phase contrast measurements utilizing a bipolar temporary magnetic gradient field having a higher-order moment, for example a second-order moment. Such a phase contrast measurement enables measurement of an acceleration of the motion of the matter. An acceleration measurement of this kind is also known from the cited Patent Re. 32,701. An example of a waveform of a bipolar temporary magnetic gradient field having a second-order moment is illustrated by FIG. 7. FIG. 7 shows a bipolar temporary magnetic gradient field 700 having a second-order moment $M_2$. The phase is dependent on the acceleration as follows:

$$\phi = \gamma M_2 a \quad (15)$$

where $\phi$ is the phase, $\gamma$ is the gyromagnetic constant and a is the acceleration. The bipolar temporary magnetic gradient field 700 having the second-order moment $M_2$ can be used in the pulse sequence 200 instead of the bipolar temporary magnetic gradient field 250. The bipolar temporary magnetic gradient field 700 is symmetrical with respect to a symmetry line 701. The actual acceleration can then be determined in the same way as described with reference to FIG. 4, but with $V^m$ and $V_{enc}$ referring to measured and encoding values, respectively, rather than measured and encoding velocities.

We claim:

1. A method of determining a velocity of moving matter by means of magnetic resonance (MR), comprising:
   a) applying a motion-encoding magnetic gradient field in at least one measuring direction and determining, from the phase of a received MR signal, a velocity component in the measuring direction but for any applicable multiple of twice an encoding velocity in the measuring direction, said encoding velocity in the measuring direction being associated with the motion-encoding magnetic gradient field applied in that direction and being chosen to be less than a maximum absolute value of said component,
   b) applying a motion-encoding magnetic gradient field in an additional direction, referred to herein as the dewrap direction, and determining, from the phase of a received MR signal, a velocity component in the dewrap direction but for any applicable multiple of twice an encoding velocity in the dewrap direction, said encoding velocity in the dewrap direction being associated with the motion-encoding magnetic gradient field applied in the dewrap direction, and
   c) determining an actual velocity component in the measuring direction, including any applicable multiple of twice the encoding velocity in the measuring direction, from the determinations in steps a) and b).

2. A method as claimed in claim 1, wherein there are at least two substantially mutually perpendicular measuring directions with respective encoding velocities, and the dewrap direction is chosen such that projections of multiples of twice the encoding velocities in the measuring directions do not coincide on a line in the dewrap direction.

3. A method as claimed in claim 2, wherein a first velocity component is determined in a first measuring direction with a first encoding velocity $V^1_{enc}$ and a second velocity component $V^2_{enc}$ is determined in a second measuring direction, which second direction extends substantially perpendicularly to the first direction, and the dewrap direction is chosen to have direction coefficients in the ratio of $$1:(2m+1)\frac{V^1_{enc}}{V^2_{enc}},$$

in which m is a positive integer.

4. A method as claimed in claim 2, wherein phase contrast measurements are applied so as to determine a first velocity component in a first measuring direction with a first encoding velocity $V^1_{enc}$, a second velocity component in a second measuring direction with a second encoding velocity $V^2_{enc}$, and a third velocity component in a third measuring direction with a third encoding velocity $V^3_{enc}$, the three measuring directions extending substantially perpendicularly to one another, and the dewrap direction is chosen to have direction coefficients in the ratio of $$1:(2m+1)\frac{V^1_{enc}}{V^2_{enc}}:(2m+1)^2\frac{V^1_{enc}}{V^3_{enc}},$$

in which m is a positive integer.

5. A method as claimed in claim 4, wherein there are at least two substantially mutually perpendicular measuring directions with respective encoding velocities, and the dewrap direction is chosen such that projections of multiples of twice the encoding values in the measuring directions do not coincide on a line in the dewrap direction.

6. A method as claimed in claim 4, wherein the maximum absolute value of a component in a measuring direction is three times the encoding value in that direction.

7. A method as claimed in claim 1, wherein a first velocity component is determined in a first measuring direction with a first encoding velocity $V^1_{enc}$ and a second velocity component $V^2_{enc}$ is determined in a second measuring direction, which second direction extends substantially perpendicularly to the first direction, and the dewrap direction is chosen to have direction coefficients in the ratio of $$1:(2m+1)\frac{V^1_{enc}}{V^2_{enc}},$$

in which m is a positive integer.

8. A method as claimed in claim 1, wherein a first velocity component is determined in a first measuring direction with a first encoding velocity $V^1_{enc}$, a second velocity component is determined in a second measuring direction with a second encoding velocity $V^2_{enc}$, and a third velocity component is determined in a third measuring direction with a third encoding velocity $V^3_{enc}$, the three measuring directions extending substantially perpendicularly to one another, and the dewrap direction is chosen to have direction coefficients in the ratio of $$1:(2m+1)\frac{V^1_{enc}}{V^2_{enc}}:(2m+1)^2\frac{V^1_{enc}}{V^3_{enc}},$$

in which m is a positive integer.

9. A method as claimed in claim 1, wherein the maximum absolute value of a velocity component in a measuring direction is three times the encoding velocity in that direction.

10. A method of determining a first or higher temporal derivative of position of moving matter by means of magnetic resonance (MR), comprising:
   a) applying a motion-encoding magnetic gradient field in at least one measuring direction and a motion-encoding magnetic gradient field in an additional direction, referred to herein as the dewrap direction, the motion-encoding magnetic gradient field in the dewrap direction being applied so as to influence a different received MR signal than that influenced by the motion-encoding magnetic gradient field applied in the at least one measuring direction,
   b) determining, from the phase of a received MR signal influenced by the motion-encoding magnetic gradient field applied in the at least one measuring direction, a component of the first or higher temporal derivative of position in the measuring direction modulo twice an encoding value in the measuring direction, said encoding value being associated with the motion-encoding magnetic gradient field applied in the measuring direction and being chosen to be less than a maximum absolute value of said component, c) determining, from the phase of a received MR signal influenced by the motion-encoding magnetic gradient field applied in the dewrap direction, a component of the first or higher order temporal derivative in the dewrap direction modulo twice an encoding value in the dewrap direction, said encoding value being associated with the motion-encoding magnetic field gradient applied in the dewrap direction, and d) determining an actual component of first or higher derivative of position in the measuring direction, including any applicable multiple of twice the encoding value in the measuring direction, from the determinations in steps b) and c).

11. A method as claimed in claim 4, wherein a first component value is determined in a first measuring direction with a first encoding value $V^1_{enc}$ and a second component value $V^2_{enc}$ is determined in a second measuring direction, which second direction extends substantially perpendicularly to the first direction, and the dewrap direction is chosen to have direction coefficients in the ratio of $$1:(2m+1)\frac{V^1_{enc}}{V^2_{enc}},$$

in which m is a positive integer.

12. A method as claimed in claim 4, wherein a first velocity component is determined in a first measuring direction with a first encoding velocity $V^1_{enc}$, a second velocity component is determined in a second measuring direction with a second encoding velocity $V^2_{enc}$, and a third velocity component is determined in a third measuring direction with a third encoding velocity $V^3_{enc}$, the three measuring directions extending substantially perpendicularly to one another, and the dewrap direction is chosen to have direction coefficients in the ratio of $$1:(2m+1)\frac{V^1_{enc}}{V^2_{enc}}:(2m+1)^2\frac{V^1_{enc}}{V^3_{enc}},$$

in which m is a positive integer.

13. An MR device for determining a first or higher temporal derivative of position of moving matter by means of magnetic resonance, comprising:

a) means for sustaining a static magnetic field, b) means for generating RF pulses, c) means for generating temporary magnetic gradient fields, d) a control unit for generating control signals for the means for generating the RF pulses and for the means for generating the temporary magnetic gradient fields, e) means for receiving, demodulating and sampling MR signals, f) a processing unit for processing the sampled MR signals, wherein:

the control unit is also arranged to apply a motion-encoding magnetic gradient field in at least one measuring direction and a motion-encoding magnetic gradient field in an additional direction, referred to herein as the dewrap direction, the motion-encoding magnetic gradient field in the dewrap direction being applied so as to influence a different received MR signal than that influenced by the motion-encoding magnetic gradient field applied in the at least one measuring direction, and the processing unit is also arranged to:

i) determine, from the phase of a received MR signal influenced by the motion-encoding magnetic gradient field in the at least one measuring direction, a component of the first or higher temporal derivative of position in the measuring direction modulo twice an encoding value in the measuring direction, said encoding value being associated with the motion-encoding magnetic gradient field applied in the measuring direction and being chosen to be less than a maximum absolute value of said component, ii) determine, from the phase of a received MR signal influenced by motion-encoding gradient in the dewrap direction, a component of the first or higher temporal derivative in the dewrap direction modulo twice an encoding value in the dewrap direction, said encoding value being associated with the motion-encoding magnetic gradient field applied in the dewrap direction, and iii) determine an actual component of first or higher order temporal derivative of position in the measuring direction, including an applicable multiple of twice the encoding value in the measuring direction, from the determinations in i) and ii).

14. A method as claimed in claim 13, wherein a first component value is determined in a first measuring direction with a first encoding value $V^1_{enc}$ and a second component value $V^2_{enc}$ is determined in a second measuring direction, which second direction extends substantially perpendicularly to the first direction, and the dewrap direction is chosen to have direction coefficients in the ratio of $$1:(2m+1)\frac{V^1_{enc}}{V^2_{enc}},$$

in which m is a positive integer.

15. A method as claimed in claim 13, wherein a first component value is determined in a first measuring direction with a first encoding value $V^1_{enc}$, a second component value is determined in a second measuring direction with a second encoding value $V^2_{enc}$, and a third component value is determined in a third measuring direction with a third encoding value $V^3_{enc}$, the three measuring directions extending substantially perpendicularly to one another, and the dewrap direction is chosen to have direction coefficients in the ratio of $$1:(2m+1)\frac{V^1_{enc}}{V^2_{enc}}:(2m+1)^2\frac{V^1_{enc}}{V^3_{enc}},$$

in which m is a positive integer.

* * * * *